United States Patent [19]
Chaudhari et al.

[11] Patent Number: 5,401,714
[45] Date of Patent: Mar. 28, 1995

[54] FIELD-EFFECT DEVICE WITH A SUPERCONDUCTING CHANNEL

[75] Inventors: Preveen Chaudhari, Briarcliff Manor, N.Y.; Carl A. Mueller, Hedingen; Hans P. Wolf, Zurich, both of Switzerland

[73] Assignee: International Business Machines Corporation, Armonk, N.Y.

[21] Appl. No.: 238,184

[22] Filed: May 4, 1994

Related U.S. Application Data

[63] Continuation of Ser. No. 935,669, Aug. 25, 1992, abandoned, which is a continuation of Ser. No. 811,889, Dec. 19, 1991, abandoned, which is a continuation of Ser. No. 297,153, Jan. 13, 1989, abandoned.

[30] Foreign Application Priority Data

Jan. 15, 1988 [EP] European Pat. Off. ........... 88100512

[51] Int. Cl.$^6$ ................... H01L 39/00; H01L 39/14; H01L 39/22
[52] U.S. Cl. ................... 505/193; 505/234; 505/330; 505/701; 505/780; 505/873; 257/38; 257/39
[58] Field of Search ................ 307/277, 245; 357/5; 257/38, 39; 505/193, 234, 330, 701, 780, 873

[56] References Cited

U.S. PATENT DOCUMENTS

| | | | |
|---|---|---|---|
| 4,589,001 | 5/1986 | Sakai et al. | 357/5 |
| 4,888,629 | 12/1989 | Harada | 357/5 |

FOREIGN PATENT DOCUMENTS

| | | |
|---|---|---|
| 60-177691 | 9/1985 | Japan . |
| 63-308975 | 12/1988 | Japan . |

OTHER PUBLICATIONS

A. F. Hebard et al. (1) "Experimental Considerations in the Quest for a Thin–Film Superconducting Field-Effect Transistor", IEEE Trans. on MAG. vol. 23, No. 2, Mar. 1987, pp. 1279–1282.

A. F. Hebard et al. (2) "Electric–Field Modulation of Low Electron Density Thin–Film Superconductors", *Novel Superconductivity*, Jun. 22–26, 1987, pp. 9–22.

A. T. Fiory et al. "Electron Mobility, Conductivity, and Superconductivity near the Metal–Insulator Transition", Phys. Rev. Lett. vol. 52, No. 23, 4 Jun. 1984, pp. 2057–2060.

P. Chaudhari et al. "Critical-Current Measurements in Epitaxial Films of $YBa_2Cu_3O_{7-x}$ Compound" Phys. Rev. Lett. vol. 58, No. 25, 22 Jun. 1987.

Fang et al "Superconducting FET" *IBM Tech Discl. Bull.* vol. 19, No. 4 pp. 1461–1462 (Sep. 1976).

Clark et al. "Ion Beam Amorphization of $YBa_2Cu_3O_x$" *Appl. Phys Lett* 51 (18) Nov. 2, 1987 pp. 1462–1464.

Fiory et al "Field Effect and electron density modulation of S/C transition in composite $In/InO_x$ Thin Films" *Physica* 135 B (1985) pp. 124–127.

Wu et al "Epitaxial Ordering of Oxide S/C Thin Films on (100) $SrTiO_3$ prepared by pulsed laser evaporation" Appl. Phys. Lett vol. 51, No. 11, Sep. 14, 1987 pp. 861–863.

C. W. Chu et. al. "Supercond. at 93°K in a new Mixed–Phase YBaCuO Comp. System at Ambient Pressure" *Phys. Rev. Lett.* 58, No. 9, Mar. 1987 pp. 908–910.

*Primary Examiner*—Andrew J. James
*Assistant Examiner*—Alice W. Tang
*Attorney, Agent, or Firm*—Daniel P. Morris

[57] ABSTRACT

A field-effect structure formed on a substrate and comprising a channel with source and drain as well as a gate that is separated from the channel by an insulating layer. The channel is made of a high $T_c$ metal-oxide superconductor, e.g., YBaCuO, having a carrier density of about $10^{21}/cm^3$ and a correlation length of about 0.2 nm. The channel thickness is preferrable in the order of 1 nm. The superconductor is preferably a single crystalline and oriented such that the superconducting behavior is strongest in the plane parallel to the substrate. With a signal of a few volts applied to the gate, the entire channel cross-section is depleted of charge carriers whereby the channel resistance can be switched between a "zero resistance" (undepleted, superconducting) state and "very high resistance" (depleted state).

20 Claims, 1 Drawing Sheet

FIELD-EFFECT DEVICE WITH A SUPERCONDUCTING CHANNEL

This is application is a continuation of application Ser. No. 07/935,669, filed Aug. 25, 1992, which is a continuation application of Ser. No. 07/811,889, filed Dec. 19, 1991, which is a continuation application of Ser. No. 07/297,153, filed Jan. 13, 1989, all now abandoned.

FIELD OF THE INVENTION

The invention concerns a field-effect device such as a field-effect transistor (FET) that can be utilized in electronic circuitry and that is suited for use in integrated circuits. The device comprises a layer of superconducting material forming the channel through which a current of charge carriers may flow, a pair of terminals for feeding a current through the channel, and a control gate for applying an electric field to the channel, the field affecting the charge carrier density within the channel zone under the gate.

BACKGROUND ART

Field-effect transistors are well known and find wide applications, for example as a switching device, in memories or in logic circuitry. FET's with semiconductor channels, mostly consisting of silicon (Si) and, more recently, of gallium arsenide (GaAs), have become an established element in data processing systems. Great progress has been made in designing fast and small dimension devices, down to sub-micron structures, that lead to high package densities and thus to high speed integrated circuits. There is, however, a need for still faster circuits.

Investigations have shown that silicon and gallium arsenide semiconductor devices can operate optimally at a temperature of about 77° K., the liquid nitrogen temperature range. This optimum performance at low temperatures, together with the fact that the resistance of metallic wiring or device connections decreases with decreasing temperature, make low temperature systems attractive.

Recording the development of low temperature devices, there have been proposals for semiconductor FET structures having superconductor source and drain electrodes and where the semiconductor current channel, due to the so-called "proximity effect", becomes superconducting in the vicinity of the superconductor electrodes. An article entitled "Three-Terminal Superconducting Devices", written by W. J. Gallagher (IEEE Trans. on Magnetics, Vol. MAG-21, No. 2, March 1985, pp. 709–716) provides a brief description of such proximity effect devices as well as prior art references. Fabrication and operating margins of these devices would, however, be rather critical.

Furthermore, there have been proposals for FET structures comprising a superconductor channel. They have been described, for example, in the following articles: "Superconducting Field-Effect Transistor" by F. F. Fang et al, (IBM Technical Disclosure Bulletin, Vol. 19, No. 4, September 1976, pp. 1461–1462), and in "Experimental Considerations in the Quest for a Thin-Film Superconducting Field-Effect Transistor" by A. F. Hebard et al (IEEE Trans. on Magnetics, Vol. MAG-23, No. 2, March 1987, pp. 1279–1282).

These articles describe studies on structures with a superconductor channel having a thickness of about 10 nm. An applied electric field causes a slight change in carrier density in a thin surface layer at the gate-superconductor interface. This change in carrier density in turn results in a shift in transition temperature $T_c$ in the thin layer. By applying signals to the gate, the thin layer can be switched between "superconducting" and "normal conducting" states. This results in a change in channel resistance.

Since the field-induced effect does not extend deeply into the channel material, various approaches to enhance the magnitude of the effect have been studied and published by A. T. Fiary and A. F. Hebard in two articles "Field-Effect and Electron Density Modulation of the Superconducting Transition in Composite In/InOx Thin Films" (Physica 135 B, 1985, pp. 124–127, North-Holland, Amsterdam) and "Electric Field Modulation of Low Electron Density Thin-Film Superconductors" (Proc. Internat. Workshop on Novel Mechanism of Superconductivity, Berkeley, June 1987). There is another article on this subject by M. Gurvitch et al, "Field Effect on Superconducting Surface Layers of $SrTiO_3$" (Materials Research Society 1986, pp. 47–49).

The drawback of these "surface effect" devices is that the change in channel resistance is still quite small. Even in the "switched" thin surface layer the change is only from metal-conducting to superconducting and, in addition, the bulk section of the channel that is not affected by the applied field acts as a metal-shunt. Therefore, the obtainable output signals are too small to be able to drive next stage FET devices.

Another drawback is that the change in $T_c$ is rather small, i.e., operating temperature ($T_{op}$) requirements are stringent since, for proper operations, the $T_c$ of the thin layer has to change from "above $T_{op}$" to "below $T_{op}$".

At present, the speed of integrated circuits is essentially determined and limited by the relatively high resistance of the wiring and device connections rather than by the devices themselves. Further progress could therefore be achieved if the wiring could be made of superconductor material. At operating temperatures below $T_c$ of the superconductor material, the line resistance would be reduced to zero and systems with devices linked by resistance-free connections offer increased speed.

This has become feasible since the discovery of a new class of high $T_c$ metal-oxide superconductors (also referred to as ceramic superconductors) that were first described by G. Bednorz and K. A. Mueller in their article "Possible High $T_c$ Superconductivity in the Ba-La-Cu-O System" (Z. Physics, Condensed Matter, Vol. 64, 1986, pp. 189–193). Further developments have resulted in metal-oxide superconductor materials, such as YBaCuO and others, having a $T_c$ well above the temperature of liquid nitrogen. One such composition has been described by C. W. Chu et al in an article "Superconductivity at 93K in a New Mixed-Phase Y-Ba-Cu-O Compound System at Ambient Pressure" (Phys. Rev. Lett. 58, No. 9, March 1987, pp. 908–910).

With this development, integrated circuits cooled with liquid nitrogen, and in which both devices and connections consist of superconductor material, are expected to become reality provided high performance devices, e.g., effective switching elements, can be designed. The obstacles encountered in using hybrid semiconductor-superconductor techniques would be removed.

SUMMARY OF THE INVENTION

It is thus a primary object of the present invention to provide a high speed superconductor field-effect device that can be fabricated using the same technology as that used to produce the device connections and that can be operated as a switch at operating temperatures below the transition temperature $T_c$ of the superconductor material.

It is another object of this invention to provide a superconductor field-effect device that exhibits a large difference in channel current when switched between its ON and OFF states.

It is another object of this invention to provide a superconductive field-effect device that provides sufficient output signals to drive other such field effect devices.

The invention as claimed is intended to meet this objective and to remedy the drawbacks of hitherto known structures. It solves the task of providing a switch having a high ON/OFF current ratio in that the thickness of the superconductor channel is made sufficiently thin so that, when applying a control signal of proper magnitude (a few Volts are sufficient) to the gate, the channel becomes completely depleted of charge carriers.

Accordingly, the device provides a high-performance switch element that is capable of switching from zero resistance (when superconducting) to "insulating" (when the channel is depleted). It also provides outputs sufficiently high to drive connected field-effect devices. Stringent operating temperature requirements are avoided because the operation does not rely on a "$T_c$-shift" effect.

The device can be produced in the same high $T_c$ superconductor technology that is used in fabricating the integrated circuit wiring and device connections. That is, the same materials can be used for the interconnect elements as are used for the device channel.

This field effect device utilizes a superconducting channel which is very thin and is comprised of a high $T_c$ superconductor, such as the oxide superconductors first described by Bednorz and Mueller. These superconductors have $T_c > 30°$ K., and include the known Y-based copper oxides with $T_c \approx 90°$ K., Bi-based copper oxides with $T_c \approx 115°$ K., and Tl-based copper oxides with $T_c$ up to about 162° K. High $T_c$ superconductors which have small correlation lengths, enabling them to be made sufficiently thin that their carrier densities can be greatly altered substantially throughout their thicknesses by the application of electric fields of reasonable magnitude, are suitable.

The device also includes source and drain regions for providing an electric current along the high $T_c$ channel, and a gate region for providing the electric field that alters the carrier density of the high $T_c$ superconductor channel substantially throughout its thickness. The gate region is generally provided by a conductive material separated from the superconductor channel by an insulating region.

In operation, the channel remains at a temperature less than the superconductive transition temperature $T_c$. When no electric field is applied, the maximum current from source to drain is the supercurrent through the channel (ON-STATE). When a sufficient electric field is applied across the channel, the carrier concentration in the channel region adjacent to the gate is substantially depleted across the thickness of the channel, thereby increasing the resistance of the channel, and decreasing current flow in the channel (OFF-STATE).

These and other objects, features and advantages will be apparent from the following more particular description of the preferred embodiments.

DESCRIPTION OF THE PREFERRED EMBODIMENTS

The inventive field-effect device comprises, in principle, the same basic elements as the surface effect superconductor FET structures that have previously been investigated and described, e.g., in the above-cited F. F. Fang et al article that was published in the IBM Technical Disclosure Bulletin.

Figure 1A:
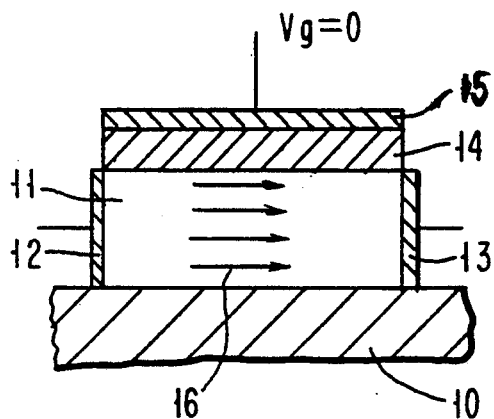
FIGS. 1A and 1B illustrate, in a schematic cross-section, the ON- and OFF-states of a prior ad FET that relies on surface field effects.
Figure 1B:
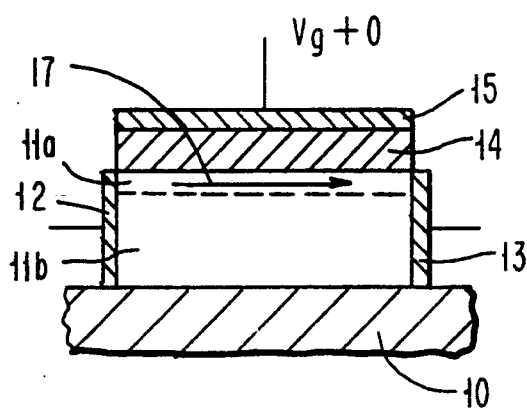

Such a prior ad structure and its operation are illustrated in FIGS. 1A and 1B. On an insulating or semi-insulating substrate 10, a superconductor channel 11 of about 10 nm thickness is deposited and provided with source 12 and drain 13 terminals. Gate 15 is separated from the channel by an insulating layer 14.

With properly chosen materials, at an operating temperature $T_{op}$ that is slightly above the transition temperature $T_c$ of the channel material, and with no gate voltage ($V_g = 0$) applied, the channel is "normal"-conducting thus providing, in the OFF-state of the device, a finite conductivity current path. It is however to be noted that, because the superconductors used are metals, the conductivity is high even in the OFF- or "normal conducting" state. In FIG. 1A, the resulting current is indicated by arrows 16. The current is equally distributed over the entire cross-section of the channel under the gate.

As illustrated in FIG. 1B, application of a non-zero voltage ($V_g \neq 0$) causes a slight change in carrier density within a thin surface layer 11a of a few tenths of a nanometer thickness near the superconductor-insulator interface. This change in carrier density results in an increase in $T_c$ within the very thin surface layer, to a value above the operating temperature $T_{op}$ of the device, thereby making the thin layer superconducting. In this ON-state, the device provides a current path of very high conductivity. Arrow 17 represents the supercurrent flowing in the now superconducting layer 11a; there is no current flow in region 11b of the channel since it is shunted by the zero-resistance superconducting region 11a. The ON/OFF-current ratio is limited because, in the OFF-state, the normal-conducting channel is still conducting a rather heavy current. Also, the current-carrying capability of the very thin channel 11a is severely restricted by the value of the maximum current density above which the material of the thin channel becomes normal-conducting. Such a FET could not provide a sufficient output to drive a subsequent FET. Furthermore, operation would be very critical with regard to slight changes in operating temperature.

Figure 2:
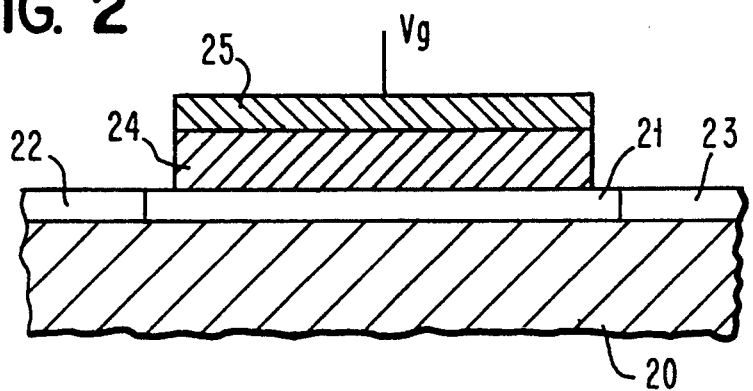
FIG. 2 is a cross-sectional view (not-to-scale) of a FET structure in accordance with the invention.

FIG. 2 illustrates the general structure of the inventive field-effect device consisting of a channel 21 which is deposited onto a substrate 20 and provided with source 22 and drain 23 leads as well as with a gate 25 that is separated from the channel by an insulating layer 24.

In a preferred embodiment, the substrate consists of strontium titanate ($SrTiO_3$) on which the channel of a high-$T_c$ superconductor material, in the example $YBa_2Cu_3O_7$, is grown. The channel is very thin, on the order of 1 nm, and is single crystalline and oriented so that the superconducting behavior is strongest in the plane parallel to the substrate surface.

For the growth of the thin channel layer an epitaxial process is used, followed by after-treatments such as oxygen anneal. Such techniques have more recently been developed. Growth processes such as molecular beam epitaxy (MBE), metal-organic vapor phase epitaxy (MOVPE) or chemical beam epitaxy (CBE) allow the growth of abrupt interfaces. In addition, the low growth rate and the precise control of the growth parameters allow the growth of very thin layers. In special modified systems, the control of the growth process can be at the atomic level. Such techniques have, for instance, been described in U.S. Pat. No. 4,058,430 and in the following articles:

1. "Growth and Characterization of Compound Semiconductors by Atomic Layer Epitaxy", M. A. Tischler et al (J. Cryst. Growth 77), 1986, pp. 89–94); and
2. "Atomic Layer Epitaxy", H. Watanabe et al (Inst. Physics Conf. Ser. No. 83, Chapter 1, 1986, pp. 1–9).

MBE-grown high-$T_c$ superconductors have been described in, for example,

1. "Growth of high-$T_c$ Superconducting Thin Films using Molecular Beam Epitaxy Techniques" by C. Webb et al (Appl. Phys. Lett. 51, October 1987, pp. 1191–1193); and
2. "Single Crystal Superconducting YBaCuO Oxide Films by Molecular Beam Epitaxy" by J. Kwo et al (Conf. Proceed. "Novel Mechanism of Superconductivity", June 22–26, 1987, Berkeley/US).

A suitable method for fabricating oriented layers using an evaporation process has been described by P. Chaudhari et al in an article entitled "Critical-Current Measurements in Epitaxial Films of YBaCuO Compound" (Phys. Rev. Lett. 58, No. 25, 1987, pp. 2684–2686).

In FIG. 2 the insulator layer 24 has a thickness that is sufficient to make tunneling effects negligible. A layer of 5 nm thick $SrTiO_3$ has been chosen, this material having a sufficiently high dielectric constant. This layer can be applied in a vapor transport process such as chemical vapor deposition.

The gate 25 is then deposited on the insulator. In this preferred embodiment it is made of a high-$T_c$ superconductor, e.g. $YBa_2Cu_3O_7$, but any ordinary metal such as gold would work as well. Where a perovskite such as $SrTiO_3$ is used as insulator, the upper part of it could be made metallic either by using a reducing ambient or by doping with Nb so that a separate evaporation of a gate layer would not be required.

Source 23 and drain 24 leads can consist of the same material as the superconductor channel or of another high-$T_c$ superconductor. An ordinary metal may also be chosen.

Patterning of the structures can be done using conventional lithographic and/or etching methods.

It should be noted that the ceramic superconductor materials such as the YBaCuO composition used in the described embodiment permit maximum current densities (above which the material becomes normal-conducting) of up to $10^7 A/cm^2$. The allowed channel current $I_{max}$ can then be calculated from the following equation $$I_{max} = i_{(max)} \times (w \times r) \qquad [1]$$

with $i_{(max)}$ = maximum current density
$w$ = channel width
$r$ = channel thickness For $w = 10\mu$ and $r = 1$ nm, the calculated maximum current is 1 mA, i.e., an operating current level that is adequate for most applications.

It is furthermore noted that the use of the very thin superconductor channel, which is in the order of 1 nm, is feasible only because of the small coherent length of about 0.2 nm along the crystallographic c-axis that is achievable with the new class of metal-oxide superconductors such as the YBaCuO composition used in the embodiment. Since superconductivity can only subsist in layers having a thickness of at least the coherent length of the superconductor material, channels of a conventional metal superconductor such as lead or niobium, having coherent lengths that are at least an order of magnitude higher than that of the metal-oxide superconductors, would have to be much thicker. This then would prevent complete channel depletion with reasonable gate voltages, i.e., the device could not operate as a switch as will be described for the inventive FET structure in the following.

Figure 3A:
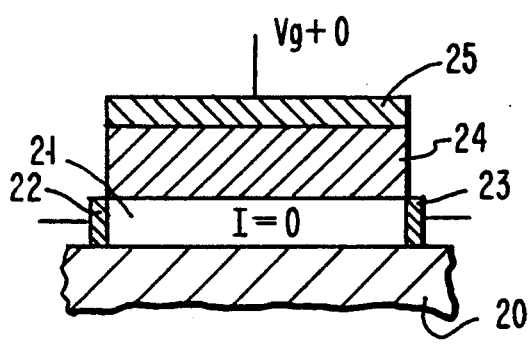
FIGS. 3A and 3B illustrate, in a schematic cross-section, the ON- and OFF-states of the FET structure shown in FIG. 2.
Figure 3B:
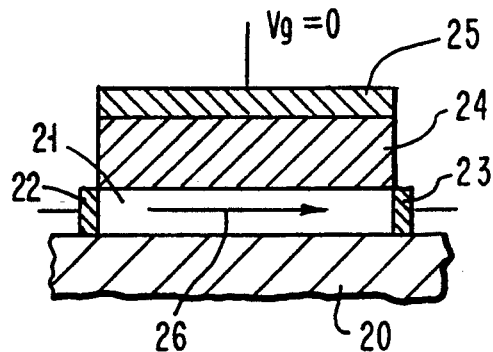

The operation of the superconductor FET will now be explained with the aid of FIGS. 3A and 3B. With no gate voltage $V_g$ applied (FIG. 3B), channel 21 is superconducting and the resistance between source 22 and drain 23 is zero. If a voltage is applied to gate 25 (FIG. 3A), the carrier concentration in the channel is changed due to the field effect. With a sufficiently high gate voltage and proper polarity (a negative voltage for electrons or a positive voltage for holes), the extremely thin channel can, in the region underneath the gate, be completely depleted of the carriers. The channel becomes insulating, i.e., the channel resistance becomes very high.

The relation between applied gate voltage $V_g$ and the depletion depth d is given by the following equation $$V_g = 1/2 \frac{qn}{\epsilon_s \epsilon_o} \cdot d^2 \left(1 + 2 t/d \frac{\epsilon_s}{\epsilon_i}\right) \qquad [2]$$

with $q$ = elemental charge
$n$ = carrier density ($10^{21}/cm^3$)
$t$ = thickness of insulating layer 24
on $\epsilon_i$, $\epsilon_s$, $\epsilon_o$ = dielectric constants of insulating layer material, superconductor and air, respectively.

The required gate voltage can be fairly low (less than about 100 volts): with $t = 5$ nm and $d = 1$ nm, the gate voltage $V_g$ required for complete carrier depletion in the channel cross-section under the gate is about 5 volts. In standard circuitry, operating with signal levels of a few volts, the described FET can thus be operated as a switch having two states: an ON-state with supercurrent flowing through the zero-resistance channel (at $V_g=0$), and an OFF-state where the channel is depleted ($V_g \neq 0$), i.e., it is insulating and the current is switched off.

The FET structure hereinabove described is distinct from previously known devices in that the channel is made thin enough to permit complete depletion of the channel cross-section under the gate, leaving no bypassing shunt. This results in an extremely high ON/OFF current ratio and provides, when operated at conventional current and voltage levels, for high outputs sufficient to drive connected FET devices. Use of the very thin ($\simeq 1$ nm) channel is feasible because

- the correlation lengths of the metal-oxide class high-$T_c$ superconductors are sufficiently low (in the order of a few tenths of a nanometer),
- these high-$T_c$ superconductors allow a high current density ($10^7 A/cm^2$) that makes the device suitable for use in today's integrated circuits, and because
- recently developed epitaxy techniques permit the growing of extremely thin layers (1 nm and less).

When operated as a switch, the invention device does not rely on any $T_c$-shift effect since there is no switching of the superconductor material between "superconducting" and "normal-conducting". Therefore, operating temperature requirements are not critical, allowing wide margins.

While the invention has been described with respect to particular embodiments thereof, it will be apparent to those of skill in the art that variations may be made therein without departing from the spirit and scope of the invention. For example, the geometry of the structure can be varied and complementary FET devices can be envisioned. By choosing high $T_c$ superconductors having small coherent lengths, the channel layer can be sufficiently thin that substantial depletion can occur substantially across the entire channel when voltage pulses of reasonable magnitude are applied to the gate. In particular, the high $T_c$ metal oxide superconductors, such as the copper oxide superconductors, are advantageous for the channel material. If voltage pulses of higher magnitude can be used, the channel layer can be thicker and/or superconductors with larger coherent lengths can be used while still obtaining a substantial carrier concentration change across the channel thickness.

What we claim as new and desire to secure by Letters Patent is:

1. A field-effect device with a channel having a superconducting property for use in electronic circuitry, the device comprising
   a layer of superconductor material forming a channel through which a current of charge carriers may flow,
   said channel has a charge carrier density and a length and a resistance,
   a pair of terminals connected respectively to the channel at locations spaced apart along the length of the channel for feeding said current through said channel,
   a control gate located proximate to the channel for applying an electric field to said channel in response to a control signal applied to the gate, the electric field affecting the charge carrier density within the channel and between the terminals,
   wherein
   said superconductor layer is sufficiently thin that, when applying said control signal of sufficient magnitude to said gate, substantially complete carrier depletion is achieved within said channel, switching the resistance of said channel from zero to insulating when said channel is depleted.

2. The field-effect device of claim 1, wherein said channel is single crystalline and oriented so that the superconducting property is strongest in a plane parallel to the length of said channel.

3. The field-effect device of claim 1, wherein said channel has a thickness of about 1 nm.

4. The field-effect device of claim 1, wherein said superconductor material forming said channel has a transition temperature $T_c$ that is higher than about 77 K.°.

5. The field-effect device of claim 1, wherein said superconducting material has a crystallographic c-axis and wherein staid superconductor material forming said channel has a coherent length of less than 0.5 nm along the crystallographic c-axis.

6. The field-effect device of claim 1, wherein said superconductor material forming said channel has said charge carrier density of less than $10^{22}/cm^3$.

7. The field-effect device of claim 1, wherein said gate is separated from said channel by an insulating layer.

8. The field-effect device of claim 7, wherein said insulating layer has a thickness that is sufficient to substantially prevent tunnel currents through the insulating layer.

9. The field-effect device of claim 8, wherein said insulating layer has a thickness of about 5 nm.

10. The field-effect device of claim 1, wherein the magnitude of the control signal required to cause complete carrier depletion in an entire cross-section of said channel is less than about ten volts.

11. A superconductive field effect device, including
    a layer of superconductive material forming a channel region through which electrical carriers can flow, said superconductive material being a metal oxide having a transition temperature greater than 77° K.,
    source and drain means for providing said electrical carriers in said channel region,
    said channel region having an electrical carrier density and a thickness and a resistance; and
    gate means for modulating the electrical carrier density across substantially the thickness of said channel region
    switching the resistance of said channel from zero to insulating when said channel is substantially completely depleted of carriers.

12. The device of claim 11, where said channel has a thickness less than about a few nanometers.

13. The device of claim 11, where the coherent length of said superconductive material is less than about 0.5 nm.

14. The device of claim 11, where said superconductive material is a copper oxide.

15. The device of claim 14, where said layer of copper oxide is a substantially epitaxial layer.

16. The device of claim 11, where said gate means includes a conductive layer separated from said superconductive layer by an insulator, and means for applying a potential of less than about 10 volts to said conductive layer.

17. A superconductive field effect device, comprising a layer of superconductive material forming a channel region through which electrical carriers can flow, said superconductive material being a metal oxide layer having a transition temperature greater than 77° K., and a thickness less than about a few nanometers and having an electrical carrier density and a resistance, source and drain means for providing said electrical carriers in said channel, and gate means for producing an electromagnetic field in said channel of sufficient strength to modulate the electrical carrier density across substantially the entire thickness of said channel switching the resistance of said channel from zero to insulating when said channel is substantially completely depleted of carriers.

18. The device of claim 17, where said gate means includes a conductive layer to which a potential of less than 10 volts can be applied for producing an electric field in said superconductive channel having a magnitude sufficient to modulate said carrier density across substantially the entire thickness of said channel.

19. The device of claim 18, where said superconductive material is a mixed copper oxide, there being an insulating layer between said conductive layer and said channel.

20. The device of claim 19, where said mixed copper oxide has a coherent length less than about 0.5 nm.

* * * * *